(12) United States Patent
Hiroki (10) Patent No.: US 11,139,185 B2
(45) Date of Patent: Oct. 5, 2021

(54) SUBSTRATE PROCESSING DEVICE AND SUBSTRATE TRANSFER METHOD

(71) Applicant: TOKYO ELECTRON LIMITED, Tokyo (JP)

(72) Inventor: Tsutomu Hiroki, Yamanashi (JP)

(73) Assignee: TOKYO ELECTRON LIMI TED, Tokyo (JP)

( * ) Notice: Subject to any disclaimer, the term of this patent is extended or adjusted under 35 U.S.C. 154(b) by 52 days.

(21) Appl. No.: 16/639,860

(22) PCT Filed: Aug. 10, 2018

(86) PCT No.: PCT/JP2018/030037
§ 371 (c)(1),
(2) Date: Feb. 18, 2020

(87) PCT Pub. No.: WO2019/039316
PCT Pub. Date: Feb. 28, 2019

(65) Prior Publication Data
US 2020/0365431 A1 Nov. 19, 2020

(30) Foreign Application Priority Data
Aug. 23, 2017 (JP) .............................. JP2017-160331

(51) Int. Cl.
*H01L 21/67* (2006.01)
*B65G 47/91* (2006.01)
*H01L 21/687* (2006.01)

(52) U.S. Cl.
CPC ........ *H01L 21/67184* (2013.01); *B65G 47/91* (2013.01); *H01L 21/67167* (2013.01); *H01L 21/67201* (2013.01); *H01L 21/68764* (2013.01)

(58) Field of Classification Search
None
See application file for complete search history.

(56) References Cited

U.S. PATENT DOCUMENTS

8,060,252 B2　11/2011　Gage et al.
2007/0040204 A1　2/2007　Kim et al.

*Primary Examiner* — Ronald P Jarrett
(74) *Attorney, Agent, or Firm* — Nath, Goldberg & Meyer; Jerald L. Meyer; Tanya E. Harkins (57) ABSTRACT

There is provided a load lock chamber including: a plurality of stages on which a plurality of first substrates that are loaded at once by means of a second transfer mechanism are respectively mounted; a moving mechanism which, in a state in which the plurality of first substrates are respectively mounted on the plurality of stages, moves the plurality of stages to narrow the interval between the plurality of stages; and a rotating mechanism which, when the plurality of first substrates are unloaded one by one by means of a first transfer mechanism, rotates the plurality of stages with the narrowed interval about an axis, and causes the plurality of first substrates successively to become closer to the first transfer mechanism around the axis.

6 Claims, 8 Drawing Sheets

SUBSTRATE PROCESSING DEVICE AND SUBSTRATE TRANSFER METHOD

This is a National Phase Application filed under 35 U.S.C. 371 as a national stage of PCT/JP2018/030,037, filed Aug. 10, 2018, an application claiming the benefit of Japanese Application No. 2017-160331, filed Aug. 23, 2017, the content of each of which is hereby incorporated by reference in its entirety.

TECHNICAL FIELD

Various aspects and embodiments of the present disclosure relate to a substrate processing device and a substrate transfer method.

BACKGROUND

Substrate processing devices that simultaneously process a plurality of substrates to improve throughput of substrate processing have been known. In such substrate processing devices, a load lock chamber capable of accommodating a plurality of substrates may be provided between an atmospheric transfer chamber and a vacuum transfer chamber. In this case, for example, a plurality of substrates is loaded into the load lock chamber simultaneously and mounted onto a plurality of stages, respectively, by transfer arms disposed in the vacuum transfer chamber. The substrates respectively mounted on the stages are unloaded one by one from the load lock chamber by a transfer arm disposed in the atmospheric transfer chamber.

Further, a technology that sequentially approaches a plurality of substrates, which are disposed around a rotary shaft of a rotary table, to a transfer arm by rotating a plurality of stages using the rotary table has been known. Since the rotary table is disposed in the load lock chamber, the transfer arm disposed in the atmospheric transfer chamber can smoothly unload the plurality of substrates one by one from the load lock chamber.

PRIOR ART DOCUMENTS

Patent Documents

Patent Document 1: U.S. Pat. No. 8,060,252 (Specification)

Patent Document 2: U.S. Patent Application Publication No. 2017/0040204 (Specification)

However, when a rotary table is provided in a load lock chamber, a dead space is provided in advance between a plurality of stages and sidewalls of the load lock chamber to avoid collision between sidewalls of the load lock chamber and the stages rotating around the rotary shaft of the rotary table. Such a dead space is a factor that causes the load lock chamber to be large.

Further, when a plurality of stages is arranged in the depth direction of the load lock chamber when viewed from a transfer arm of the atmospheric side, the transfer arm of the atmospheric side requires a long driving stroke and a high-strength driving structure. The long driving stroke and high-strength driving structure are factors cause an increase in cost.

SUMMARY

According to one embodiment of the present disclosure, there is provided a substrate processing device including: a load lock chamber disposed between a first transfer chamber and a second transfer chamber and being capable of accommodating a plurality of substrates; a first transfer mechanism disposed in the first transfer chamber and transferring the plurality of substrates one by one; and a second transfer mechanism disposed in the second transfer chamber and simultaneously transferring the plurality of substrates, wherein the load lock chamber comprises: a plurality of stages on which a plurality of first substrates, which are simultaneously loaded by the second transfer mechanism, are mounted, respectively; a moving mechanism moving the plurality of stages so as to decrease gaps between the plurality of stages, in a state in which the plurality of first substrates are mounted on the plurality of stages, respectively; and a rotating mechanism rotating, around an axial line, the plurality of stages having the decreased gaps so as to move the plurality of first substrates disposed around the axial line sequentially toward the first transfer mechanism, when the plurality of first substrates is unloaded one by one by the first transfer mechanism.

According to an embodiment of the substrate processing device of the present disclosure, it is possible to suppress an increase in size of a load lock chamber capable of accommodating a plurality of substrates.

DETAILED DESCRIPTION

Hereinafter, embodiments of a substrate processing device and a substrate transfer method of the present disclosure are described in detail with reference to the accompanying drawings. Further, the same or similar components are given the same reference numerals in the drawings.

<Substrate Processing Device>

Figure 1:
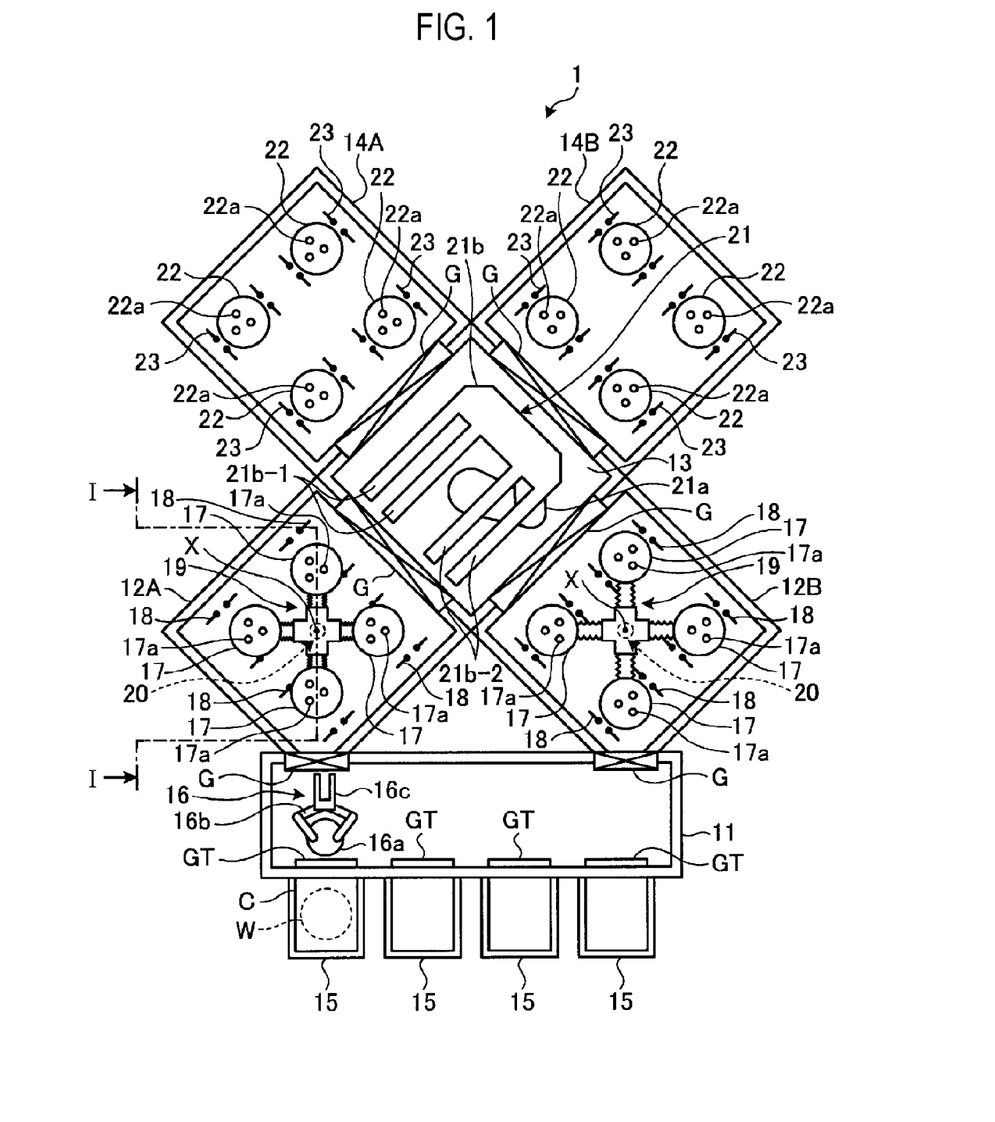
FIG. 1 is a view showing an exemplary configuration of a substrate processing device according to an embodiment of the present disclosure.

First, a configuration of a substrate processing device according to an embodiment of the present disclosure is described. The substrate processing device is a device that performs a predetermined substrate processing on substrates such as semiconductor wafers. In the present embodiment, a process of forming a film on a substrate is described as an example. FIG. 1 is a view showing an exemplary configuration of a substrate processing device 1 according to a present embodiment. The substrate processing device 1 includes an atmospheric transfer chamber 11 for loading substrates W to be processed into the substrate processing device 1, for example two load lock chambers 12A and 12B, a vacuum transfer chamber 13, and for example two processing modules 14A and 14B.

The processing modules 14A and 14B are configured to maintain a vacuum atmosphere in the internal spaces thereof. Four mounting tables 22 on which four substrates W are respectively mounted are disposed in each of the processing modules 14A and 14B. Each of the mounting tables 22 has support pins 22a that can move up/down. Further, support members 23 that can move up/down and rotate in a horizontal direction are disposed at corresponding positions around each of the mounting tables 22 at bottom portions of the processing modules 14A and 14B. In the processing modules 14A and 14B, the substrates W can be transferred between the mounting tables 22 and a second transfer mechanism 21 to be described below, using the support pins 22a and the support members 23. The processing modules 14A and 14B perform a predetermined substrate processing on the substrates W while the substrates W are respectively mounted on the mounting tables 22. In the present embodiment, an exemplary case in which the processing modules 14A and 14B are film-forming modules that perform film-forming processing on the substrates W is described.

The atmospheric transfer chamber 11 is connected to the vacuum transfer chamber 13 via the load lock chambers 12A and 12B. The processing modules 14A and 14B are connected to the vacuum transfer chamber 13 so as to be separated from the load lock chambers 12A and 12B.

The atmospheric transfer chamber 11 is configured to maintain an atmospheric atmosphere in its internal space. The atmospheric transfer chamber 11 is provided with carrier mounting tables 15 on which carriers C that accommodate a plurality of substrates W are loaded Gate doors GT to which the carriers C are connected and which open/close with covers of the carriers C are provided in a front wall of the atmospheric transfer chamber 11. A stocker (not shown) for temporarily keeping the substrates W, an alignment chamber (not shown) for aligning substrates W, or the like is provided on a sidewall of the atmospheric transfer chamber 11.

A first transfer mechanism 16 is disposed in the atmospheric transfer chamber 11. The first transfer mechanism 16 transfers four substrates W one by one between the carriers C and the load lock chamber 12A or the load lock chamber 12B. The four substrates W that are unloaded from the carriers C and then loaded into the load lock chambers 12A and 12B by the first transfer mechanism 16 are substrates on which the films have not been formed yet (hereinafter, the substrates without films thereon). The four substrates W that are unloaded from the load lock chambers 12A and 12B and then loaded into the carriers C by the first transfer mechanism 16 are substrates on which the film formation has been performed (hereinafter, the substrates with films thereon). The substrate W with a film thereon is an example of a "first substrate" and the substrate W without a film thereon is an example of a "second substrate." The first transfer mechanism 16 has a base 16a, two multi-joint arms 16b, and two supports 16c (only one support 16c is shown in FIG. 1). Each of the two arms 16b has a base end connected to the base 16a and a front end connected to each of the two supports 16c. The base 16a is configured to move in a transverse direction and move up/down. The two supports 16c are disposed in an up-down direction with a gap therebetween and separately support substrates W. The atmospheric transfer chamber 11 is an example of a "first transfer chamber."

The load lock chambers 12A and 12B are provided between the atmospheric transfer chamber 11 and the vacuum transfer chamber 13, and are configured to be able to accommodate four substrates W. Four stages 17 are provided in each of the load lock chambers 12A and 12B. The four substrates W, which are simultaneously loaded into each of the load lock chambers 12A and 12B by the second transfer mechanism 21, are mounted on the four stages 17, respectively. Further, four substrates W without films thereon, which are loaded one by one into each of the load lock chambers 12A and 12B by the first transfer mechanism 16, are mounted on the four stages 17, respectively, in place of the four substrates W with films formed thereon, which are unloaded one by one from the load lock chambers 12A and 12B by the first transfer mechanism 16. Each of the stages 17 is provided with support pins 17a that can move up/down. Support members 18 that can move up/down and rotate in a horizontal direction are provided at predetermined positions on the bottom portions of the load lock chambers 12A and 12B. In the load lock chambers 12A and 12B, the substrates W can be transferred between the stages 17 and the second transfer mechanism 21, using the support pins 17a and the support members 18. Further, in the load lock chambers 12A and 12B, the substrates W can be transferred between the stages 17 and the first transfer mechanism 16, using the support pins 17a.

Each of the load lock chambers 12A and 12B has a moving mechanism 19 and a rotating mechanism 20. The moving mechanism 19 moves the four stages 17 in a state that the four substrates W with films thereon, which have been loaded simultaneously by the second transfer mechanism 21, are mounted on the four stages 17, respectively, so as to decrease the gaps between the four stages 17. When the four substrates W with films thereon are simultaneously loaded into each of the load lock chambers 12A and 12B by the second transfer mechanism 21, the gaps between the four stages 17 are set to be the same as the gaps between the four mounting tables 22 disposed in the processing modules 14A and 14B. Accordingly, after the four substrates W with films thereon that are loaded by the second transfer mechanism 21 are mounted on the four stages 17, respectively, the moving mechanism 19 decreases the gaps between the four stages 17 by moving the four stages 17 to make the gaps between the four stages 17 be smaller than the gaps between the four mounting tables 22. As a result, a space is formed between the four stages 17 and the sidewall of each of the load lock chambers 12A and 12B.

Further, when the four substrates W without films thereon are simultaneously unloaded by the second transfer mechanism 21, the moving mechanism 19 moves the four stages 17 in a state where the four substrates W without films thereon are mounted on the four stages 17, respectively, so as to return the gaps between the four stages 17 to the initial gaps. The initial gaps are the same gaps as the gaps between the four mounting tables 22 provided in each of the processing modules 14A and 14B.

When the four substrates W with films thereon are unloaded one by one by the first transfer mechanism 16, the rotating mechanism 20 moves the four substrates W with films thereon disposed around an axial line X sequentially toward the first transfer mechanism 16 by rotating the four stages 17 having the decreased gaps around the axial line X. As described above, a space is formed between the four stages 17 having the decreased gaps and the sidewall of each of the load lock chambers 12A and 12B. The space allows avoidance of a collision of the four stages 17 that are rotating and the sidewalls of the load lock chambers 12A and 12B. That is, even if a dead space is not provided in advance between the four stages 17 and the sidewalls of the load lock chambers 12A and 12B, a collision of the four stages 17 that are rotating and the sidewalls of the load lock chambers 12A and 12B is avoided. The moving mechanism 19 and the rotating mechanism 20 will be described later in detail.

A vacuum pump and a leak valve, which are not shown in the figures, are provided in each of the load lock chambers 12A and 12B. The atmosphere of the load lock chambers 12A and 12B is capable of switching between an atmospheric atmosphere and a vacuum atmosphere by the vacuum pump and the leak valve. That is, since the atmospheric transfer chamber 11 is maintained in an atmospheric atmosphere and the vacuum transfer chamber 13 is maintained in a vacuum atmosphere, the atmosphere of the load lock chambers 12A and 12B is switched in order to transfer substrates W between the atmospheric transfer chamber 11 and the vacuum transfer chamber 13.

The vacuum transfer chamber 13 is configured to maintain a vacuum atmosphere in its internal space. A second transfer mechanism 21 is disposed in the vacuum transfer chamber 13. The second transfer mechanism 21 simultaneously transfers the four substrates W between the processing modules 14A and 14B and the load lock chambers 12A and 12B without changing the gaps between the four substrates W. The second transfer mechanism 21 has a multi-joint arm 21a and a support 21b. The arm 21a has a base end connected to a bottom portion of the vacuum transfer chamber 13 and a front end connected to the support 21b. The support 21b has four top forks 21b-1 and four bottom forks 21b-2 disposed up and down with gaps therebetween (only four top forks 21b-1 are shown in FIG. 1). The support 21b supports the four substrates W without films thereon by the top forks 21b-1 and supports the four substrates W with films thereon by the bottom forks 21b-2. The vacuum transfer chamber 13 is an example of a "second transfer chamber."

In FIG. 1, "G" indicates gate valves (partition valves) that can be opened/closed, and partitions between the respective chambers and between the processing modules 14A and 14B and the vacuum transfer chamber 13. The gate valves G are normally closed, but are opened when the substrates W are transferred between the respective chambers and between the processing modules 14A and 14B and the vacuum transfer chamber 13.

<Moving Mechanism & Rotating Mechanism>

Figure 2:
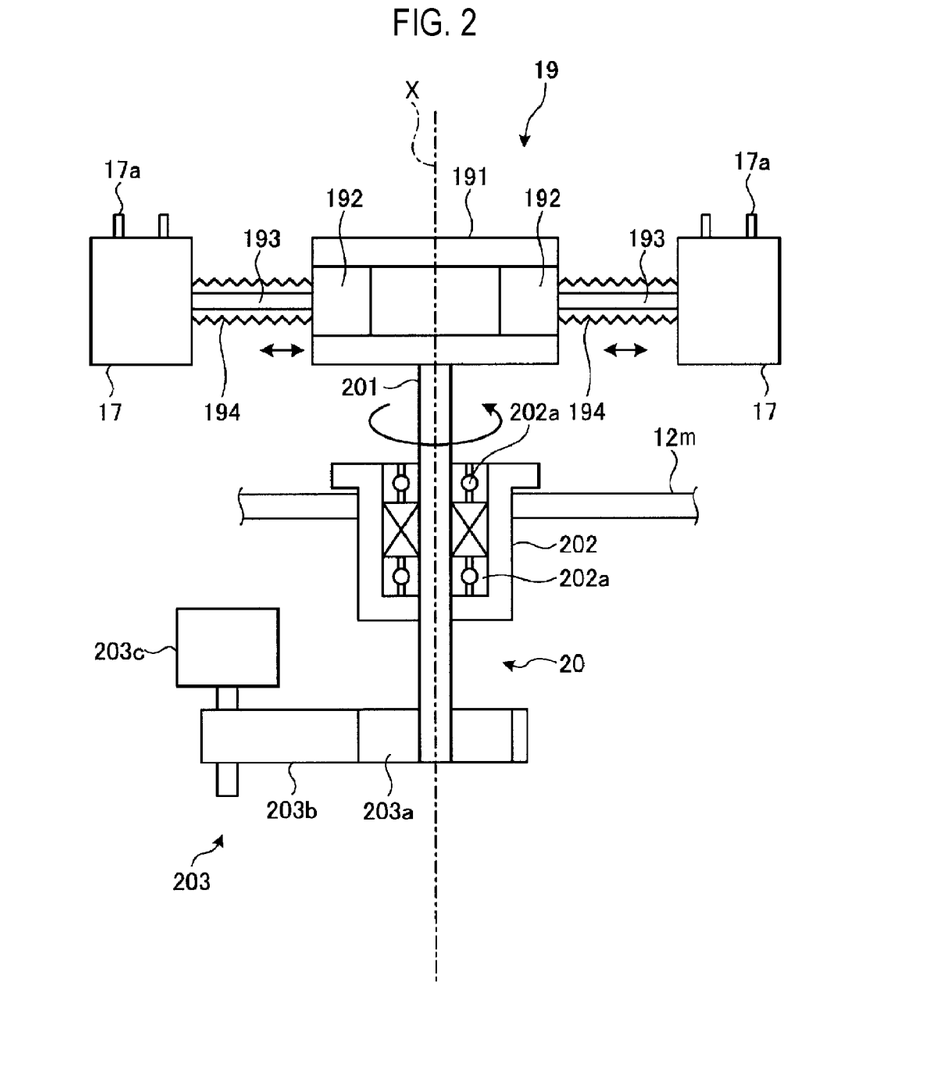
FIG. 2 is a cross-sectional view showing an exemplary configuration of a moving mechanism and a rotating mechanism.

Next, the moving mechanism 19 and the rotating mechanism 20 shown in FIG. 1 are described in detail. FIG. 2 is a cross-sectional view showing an exemplary configuration of the moving mechanism 19 and the rotating mechanism 20. FIG. 2 corresponds to a cross-sectional view taken along line I-I shown in FIG. 1.

The moving mechanism 19, as shown in FIG. 2, includes a hollow base member 191, driving devices 192 such as an air cylinder, and support rods 193.

The base member 191 holds and supports the driving devices 192, and is supported by a rotary shaft 201 of the rotating mechanism 20 to be described below. The driving devices 192 transmit a driving force to the support rods 193 for moving forward/backward with respect to the base member 191.

The support rod 193 has one end coupled to the driving device 192 so as to be able to move forward/backward and has the other end supporting the stage 17. A vicinity of the support rod 193 is covered with a bellows 194. The support rod 193 is moved forward/backward with respect to the base member 191 by the driving force transmitted from the driving devices 192. As the support rods 193 are moved forward/backward, four stages 17 are moved toward or away from the base member 191. Accordingly, the gaps between the four stages 17 are decreased or returned to the initial gaps.

The rotating mechanism 20, as shown in FIG. 2, include a rotary shaft 201, a casing 202 that holds and supports the rotary shaft 201 through a bearing 202a, and a rotational driving device 203 that rotates the rotary shaft 201.

The rotary shaft 201 supports the base member 191 and extends outside a bottom portion 12m of the load lock chamber 12A along the axial line X.

The casing 202 has an opening having an inner diameter larger than the outer diameter of the rotary shaft 201. The rotary shaft 201 is inserted through the opening of the casing 202 and is rotatably supported by the bearing 202a. An upper end of the casing 202 is fixed to the bottom portion 12m of the load lock chamber 12A by a fixing member such as a bolt.

The rotational driving device 203 includes a pulley 203a, a driving belt 203b, and a motor 203c. The pulley 203a is mounted on a lower end portion of the rotary shaft 201. The driving belt 203b is wound on the pulley 203a.

The motor 203c has an output shaft connected to the driving belt 203b and transmits a rotational force to the rotary shaft 201 through the driving belt 203b and the pulley 203a. The rotary shaft 201 is rotated about the axial line X by the rotational force transmitted from the motor 203c. The base member 191 of the moving mechanism 19 is supported by the rotary shaft 201. The stages 17 are supported by the support rods 193 of the moving mechanism 19. Accordingly, as the rotary shaft 201 is rotated, the four stages 17 are rotated about the axial line X together with the moving mechanism 19.

Example of Flow of Substrate Transfer Processing

Figure 3:
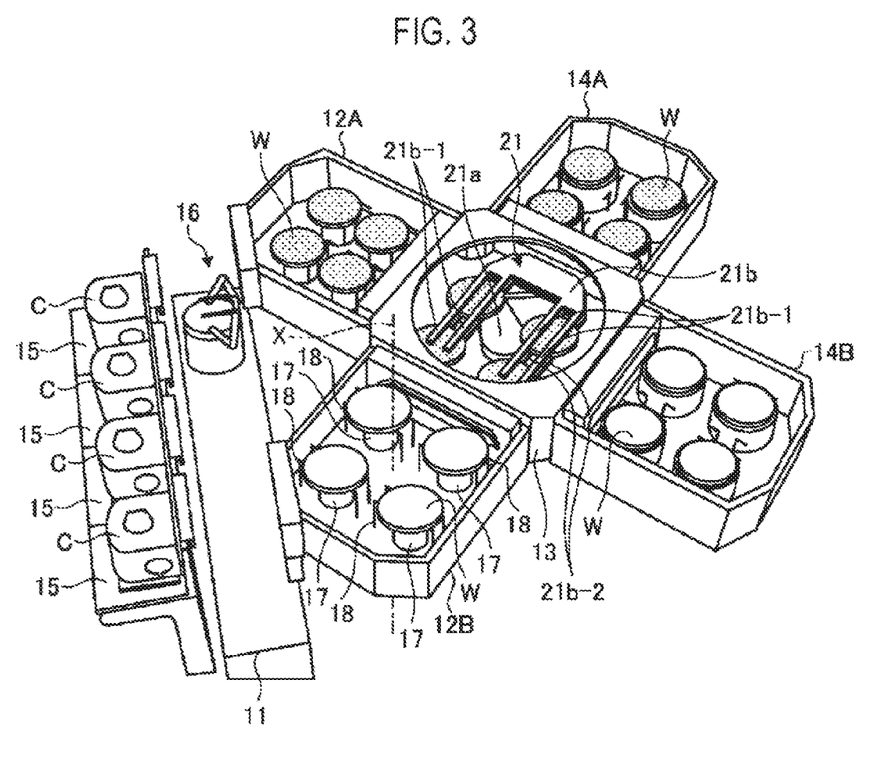
FIG. 3 is a view illustrating an example of a flow of a process of transferring substrates by the substrate processing device according to an embodiment of the present disclosure.

Next, an example of a flow of a process of transferring the substrates W by the substrate processing device 1 according to the present embodiment is described with reference to FIGS. 3 to 8. FIGS. 3 and 8 are diagrams for explaining an example of the flow of transferring the substrates W by the substrate processing device 1 according to the present embodiment. In FIGS. 3 to 8, hatched substrates W are the substrates W with films thereon, and non-hatched substrates W are the substrates W without films formed thereon. Further, in FIGS. 3 to 8, the moving mechanism 19 and the rotating mechanism 20 are not shown for the convenience of description. Further, an explanation will be made mainly on an example in which a substrate W is transferred between the atmospheric transfer chamber 11 and the vacuum transfer chamber 13 via the load lock chamber 12B.

First, the second transfer mechanism 21, as shown in FIG. 3, receives four substrates W with films formed thereon from the processing module 14B using the bottom forks 21b-2 of the support 21b. The four substrates W with films formed thereon supported by the bottom forks 21b-2 are simultaneously loaded into the load lock chamber 12B. At this time, as the support members 18 are rotated and elevated in the load lock chamber 12B, the four substrates W without films formed thereon are separated from the four stages 17.

Figure 4:
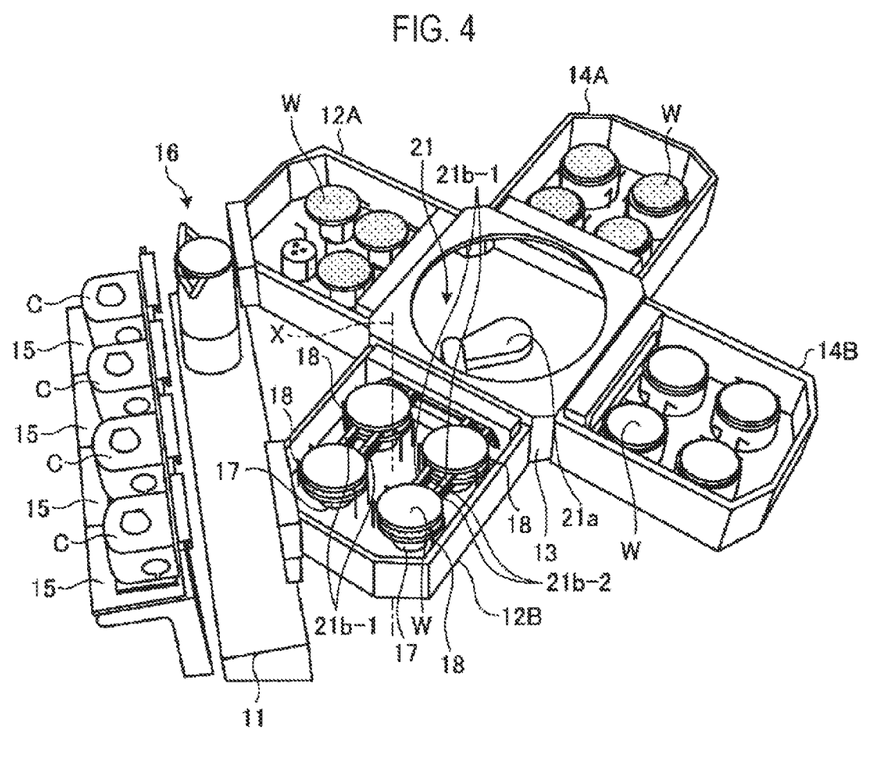
FIG. 4 is a view illustrating an example of the flow of the process of transferring substrates by the substrate processing device according to an embodiment of the present disclosure.

Further, the supports 21b of the second transfer mechanism 21 are advanced under the four substrates W without films formed thereon, which has been separated from the four stages 17. Next, as the support members 18 are moved down and rotated, as shown in FIG. 4, the four substrates W without films formed thereon are transferred to the top forks 21b-1 of the support 21b of the second transfer mechanism 21. Meanwhile, as the support pins 17a are elevated from each of the stages 17, the four substrates W with films formed thereon supported by the bottom forks 21b-2 are raised up from the bottom forks 21b-2.

Figure 5:
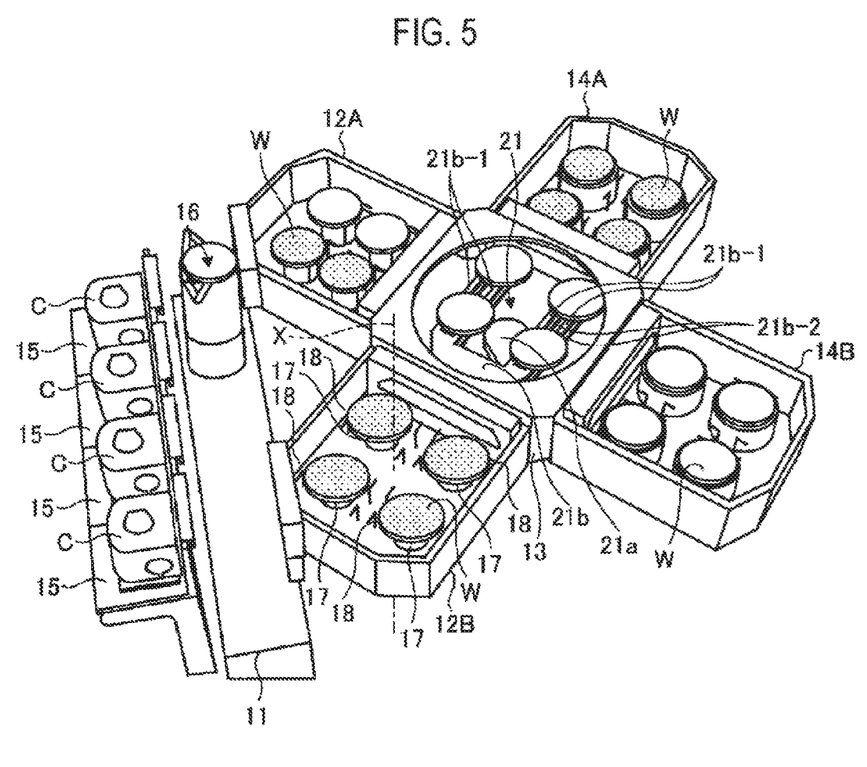
FIG. 5 is a view illustrating an example of the flow of the process of transferring substrates by the substrate processing device according to an embodiment of the present disclosure.

Next, as shown in FIG. 5, as the support 21b of the second transfer mechanism 21 is retracted from the load lock chamber 12B and the support pins 17a are moved down, the four substrates W with films formed thereon are respectively transmitted to the four stages 17 from the support pins 17a. Accordingly, the four substrates W with films formed thereon are mounted on the four stages 17, respectively.

Figure 6:
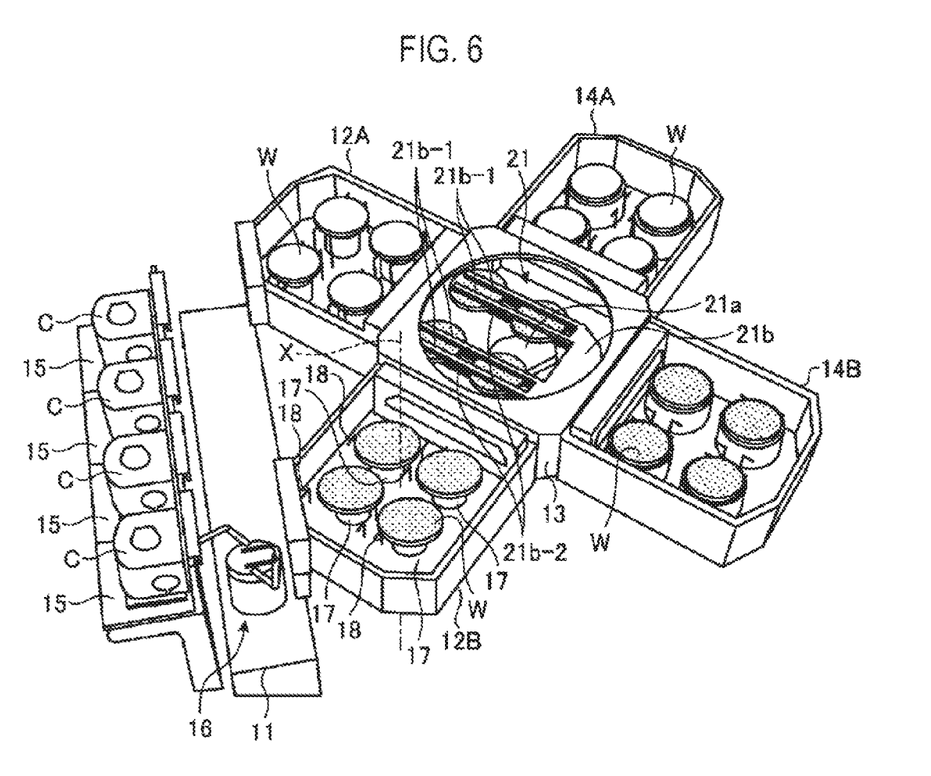
FIG. 6 is a view illustrating an example of the flow of the process of transferring substrates by the substrate processing device according to an embodiment of the present disclosure.

Next, as shown in FIG. 6, in a state where the four substrates W with films formed thereon respectively are mounted on the four stages 17, the four stages 17 are moved in a direction toward the axial line X by the moving mechanism 19. Accordingly, the gaps between the four stages 17 are decreased.

Figure 7:
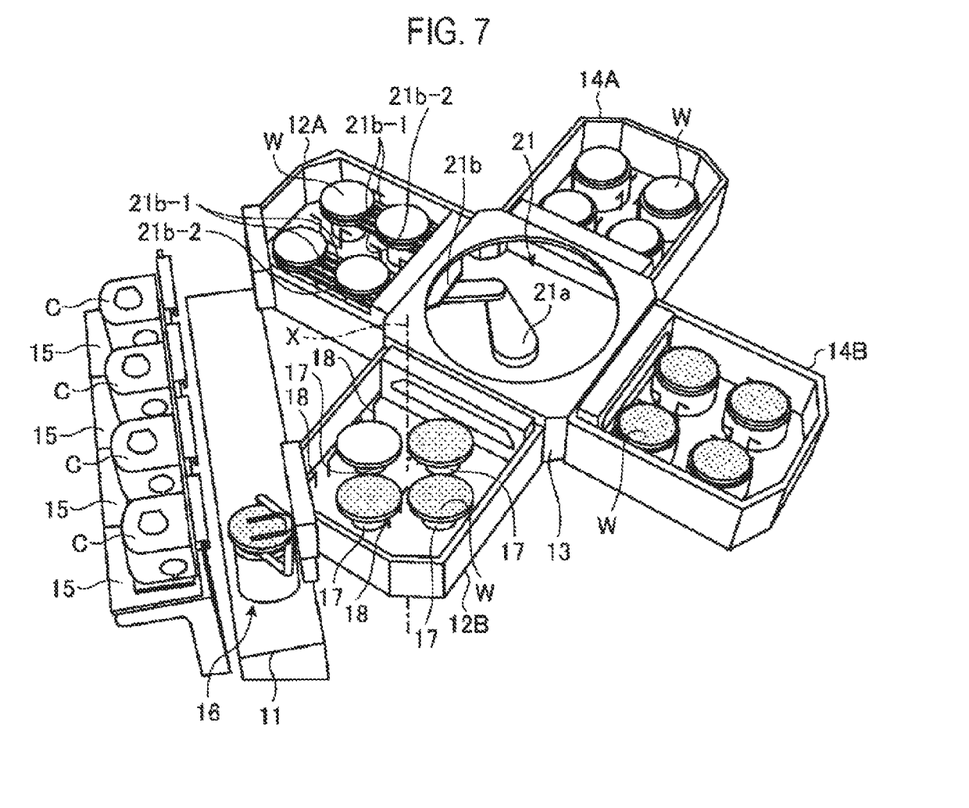
FIG. 7 is a view illustrating an example of the flow of the process of transferring substrates by the substrate processing device according to an embodiment of the present disclosure.
Figure 8:
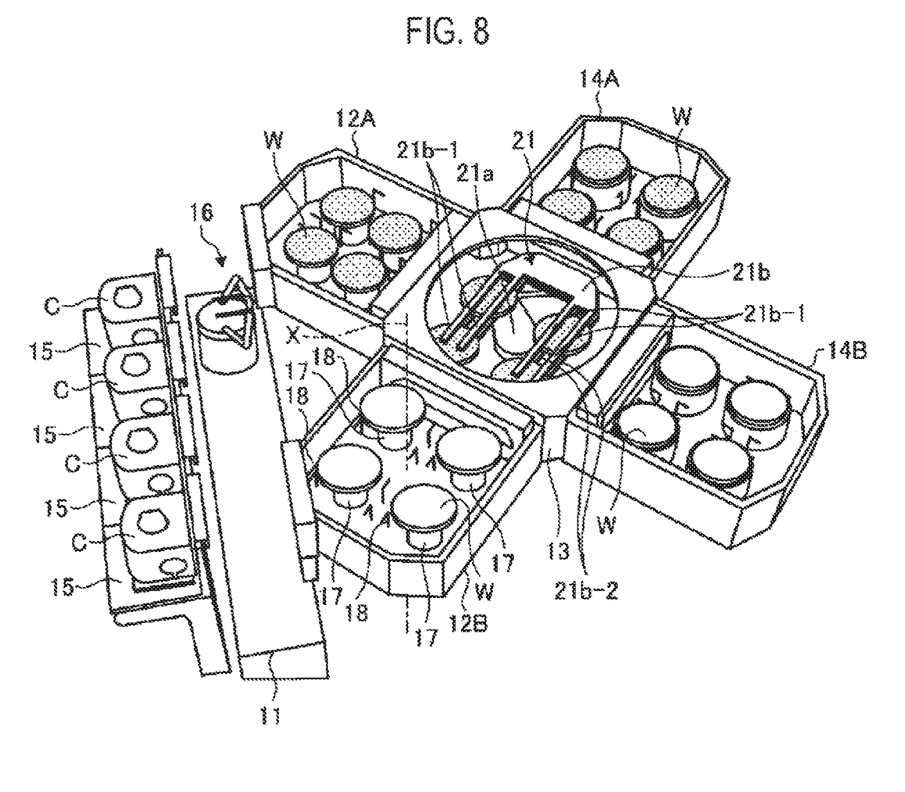
FIG. 8 is a view illustrating an example of the flow of the process of transferring substrates by the substrate processing device according to an embodiment of the present disclosure.

Next, when the four substrates W with films formed thereon are unloaded one by one from the load lock chamber 12B by the first transfer mechanism 16, as shown in FIG. 7, the four stages 17 having the decreased gaps are rotated about the axial line X by the rotating mechanism 20. Accordingly, the four substrates W with films formed thereon disposed around the axial line X are sequentially moved toward the first transfer mechanism 16. The first transfer mechanism 16 unloads the four substrates W with films formed thereon one by one from the load lock chamber 12B, and loads the four substrates W without films formed thereon one by one into the load lock chamber 12B from the carriers C. Accordingly, the four substrates W without films formed thereon are mounted on the four stages 17, respectively, in place of the four substrates W with films formed thereon.

Next, when the four substrates W without films formed thereon are simultaneously unloaded from the load lock chamber 12B by the second transfer mechanism 21, the four stages 17 are moved away from the axial line X in a state where the four substrates W without films formed thereon respectively are mounted on the four stages 17, as shown in FIG. 8. Accordingly, the gaps between the four stages 17 are returned to the initial gaps.

As described above, in the substrate processing device 1 according to the present embodiment, the load lock chambers 12A and 12B, which are disposed between the atmospheric transfer chamber 11 and the vacuum transfer chamber 13, each include the four stages 17, the moving mechanism 19, and the rotating mechanism 20. The four substrates W with films formed thereon, which are simultaneously loaded by the second transfer mechanism 21 disposed in the vacuum transfer chamber 13, are respectively mounted on the four stages 17. The moving mechanism 19 decreases the gaps between the four stages 17 by moving the four stages 17 in a state where the four substrates W with films formed thereon are mounted on the four stages 17, respectively. When the four substrates W with films formed thereon are unloaded by the first transfer mechanism 16 disposed in the atmospheric transfer chamber 11, the rotating mechanism 20 moves the four substrates W with films formed thereon disposed around the axial line sequentially toward the first transfer mechanism 16 by rotating, around the axial line, the four stages 17 having the decreased gaps. Therefore, according to the substrate processing device 1, even if a dead space is not provided in advance between the four stages 17 and the load lock chambers 12A and 12B, it is possible to avoid a collision of the four stages 17 that are rotating and the sidewalls of the load lock chambers 12A and 12B. As a result, according to the substrate processing device 1 of the present embodiment, it is possible to suppress an increase in the size of the load lock chambers 12A and 12B capable of accommodating the plurality of substrates W.

Further, the present disclosure is not limited to the above embodiment and may be changed in various ways within the spirit thereof.

For example, in the above embodiment, an example has been described in which the processing modules 14A and 14B are film-forming modules that perform film-forming processing on substrates W, but the technology disclosed herein is not limited thereto. The processing modules 14A and 14B may be plasma etching modules that perform plasma etching processing on substrates W.

Further, in the above embodiment, an example has been described where four mounting tables 22 on which four substrates W are respectively mounted are disposed in each of the processing modules 14A and 14B, but the technology disclosed herein is not limited thereto. At least two mounting tables 22 may be disposed in each of the processing modules 14A and 14B. In this case, at least two stages 17 may be disposed in each of the load lock chambers 12A and 12B.

Further, in the above embodiment, an example has been described in which the four substrates W with films formed thereon are randomly unloaded one by one from each of the load lock chambers 12A and 12B by the first transfer mechanism 16, but the technology disclosed herein is not limited thereto. The first transfer mechanism 16 may unload the four substrates W with films formed thereon one by one in a predetermined order from each of the load lock chambers 12A and 12B. The predetermined order is, for example, the order in which the four substrates W without films formed thereon are loaded one by one into each of the load lock chambers 12A and 12B by the first transfer mechanism 16.

EXPLANATION OF REFERENCE NUMERALS

1: substrate processing device
11: atmospheric transfer chamber
12A, 12B: load lock chamber
13: vacuum transfer chamber
14A, 14B: processing module
16: first transfer mechanism
19: moving mechanism
20: rotating mechanism
21: second transfer mechanism
W: substrate
X: axial line

What is claimed is:
1. A substrate processing device comprising:
a load lock chamber disposed between a first transfer chamber and a second transfer chamber and being capable of accommodating a plurality of substrates;

a first transfer mechanism disposed in the first transfer chamber and transferring the plurality of substrates one by one; and a second transfer mechanism disposed in the second transfer chamber and simultaneously transferring the plurality of substrates, wherein the load lock chamber comprises:
- a plurality of stages on which a plurality of first substrates, which are simultaneously loaded by the second transfer mechanism, are mounted, respectively;
- a moving mechanism moving the plurality of stages so as to decrease gaps between the plurality of stages, in a state in which the plurality of first substrates are mounted on the plurality of stages, respectively; and
- a rotating mechanism rotating, around an axial line, the plurality of stages having the decreased gaps so as to move the plurality of first substrates disposed around the axial line sequentially toward the first transfer mechanism, when the plurality of first substrates is unloaded one by one by the first transfer mechanism.

2. The substrate processing device of claim 1, wherein a plurality of second substrates that are loaded one by one by the first transfer mechanism is mounted on the plurality of stages, respectively, in place of the plurality of first substrates that are unloaded one by one by the first transfer mechanism, and when the plurality of second substrates is simultaneously unloaded by the second transfer mechanism, the moving mechanism moves the plurality of stages in a state in which the plurality of second substrates is respectively mounted on the plurality of stages, so as to return the gaps between the plurality of stages to an initial stage.

3. The substrate processing device of claim 2, further comprising a processing module connected to the second transfer chamber and performing a predetermined process on the plurality of substrates, wherein the second transfer mechanism simultaneously transfers the plurality of substrates between the processing module and the load lock chamber without changing gaps between the plurality of substrates.

4. The substrate processing device of claim 1, further comprising a processing module connected to the second transfer chamber and performing a predetermined process on the plurality of substrates, wherein the second transfer mechanism simultaneously transfers the plurality of substrates between the processing module and the load lock chamber without changing gaps between the plurality of substrates.

5. The substrate processing device of claim 1, wherein a plurality of the load lock chamber is installed.

6. A substrate transfer method in a substrate processing device that includes: a load lock chamber disposed between a first transfer chamber and a second transfer chamber and being capable of accommodating a plurality of substrates; a first transfer mechanism disposed in the first transfer chamber and transferring the plurality of substrates one by one; and a second transfer mechanism disposed in the second transfer chamber and simultaneously transferring the plurality of substrates, the method comprising:
- loading a plurality of first substrates, which are simultaneously loaded into the load lock chamber by the second transfer mechanism, onto a plurality of stages, respectively;
- decreasing gaps between the plurality of stages by moving the plurality of stages, in a state in which the plurality of first substrates are mounted on the plurality of stages, respectively; and
- sequentially moving the plurality of first substrates disposed around an axial line toward the first transfer mechanism by rotating, around the axial line, the plurality of stages having the decreased gaps, when the plurality of first substrates is unloaded one by one from the load lock chamber by the first transfer mechanism.

* * * * *

UNITED STATES PATENT AND TRADEMARK OFFICE
CERTIFICATE OF CORRECTION

| | |
|---|---|
| PATENT NO. | : 11,139,185 B2 |
| APPLICATION NO. | : 16/639860 |
| DATED | : October 5, 2021 |
| INVENTOR(S) | : Tsutomo Hiroki |

Page 1 of 1

It is certified that error appears in the above-identified patent and that said Letters Patent is hereby corrected as shown below:

On the Title Page

Item (73), please remove the Assignee "TOKYO ELECTRON LIMI TED" and replace with "TOKYO ELECTRON LIMITED".

Signed and Sealed this
Seventh Day of December, 2021

Drew Hirshfeld
*Performing the Functions and Duties of the*
*Under Secretary of Commerce for Intellectual Property and*
*Director of the United States Patent and Trademark Office*